(12) United States Patent
Kao et al.

(10) Patent No.: US 7,141,469 B2
(45) Date of Patent: Nov. 28, 2006

(54) METHOD OF FORMING POLY INSULATOR POLY CAPACITORS BY USING A SELF-ALIGNED SALICIDE PROCESS

(75) Inventors: Jung-Cheng Kao, Shanghai (CN); Hao Fang, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 89 days.

(21) Appl. No.: 10/967,198

(22) Filed: Oct. 19, 2004

(65) Prior Publication Data

US 2005/0085046 A1  Apr. 21, 2005

(30) Foreign Application Priority Data

Oct. 21, 2003 (CN) .................. 2003 1 0108060

(51) Int. Cl.
*H01L 21/8238* (2006.01)

(52) U.S. Cl. .................. 438/210; 438/239; 438/649; 438/664

(58) Field of Classification Search .............. 438/197, 438/199–200, 210, 239, 241, 299, 649, 651, 438/655, 660–664
See application file for complete search history.

(56) References Cited

U.S. PATENT DOCUMENTS 6,303,455 B1 * 10/2001 Hou et al. .................. 438/381
2002/0142540 A1 * 10/2002 Katayama .................. 438/239

* cited by examiner

*Primary Examiner*—Thanhha S. Pham
(74) *Attorney, Agent, or Firm*—Rosenberg, Klein & Lee

(57) ABSTRACT

A method of forming poly insulator poly capacitors by using self-aligned salicide process for mixed mode analog devices. These capacitors are formed in the self-aligned salicide process as stacked poly insulator poly (PIP) capacitors. In the self-aligned salicide process, a self-aligned salicide block process is needed to protect the the salicide formation process from electrostatic discharge (ESD) devices such as resistors or capacitors. The oxide layer of the self-aligned salicide block is used as the dielectric layer of the capacitors to form the PIP capacitor. Therefore, some process steps are omitted due to the formation of the PIP capacitors.

8 Claims, 6 Drawing Sheets

METHOD OF FORMING POLY INSULATOR POLY CAPACITORS BY USING A SELF-ALIGNED SALICIDE PROCESS

BACKGROUND OF THE INVENTION

1. Field of the Invention

The present invention generally relates to a method of fabricating mixed mode analog devices, and more particularly relates to a method of forming poly insulator poly (PIP) capacitors by using a self-aligned salicide process.

2. Description of the Prior Art

Mixed mode analog devices simultaneously have circuits with digital devices such as amplifiers and analog digital converters and analog devices such as inverters and adders. Also, mixed mode analog devices include MOS devices.

As the semiconductor devices in deep sub-micron process are highly integrated, a capacitor, such as shown in FIG. 1 is introduced in the fabrication of the semiconductor devices.

Referring to FIG. 1 which is a drawing illustrating a conventional capacitor, a shallow trench isolation (STI) structure 12, a transistor gate structure 14, a lightly doped source/drain area 16, a gate spacer 18, and a heavily doped source/drain 20 in sequence are formed on a semiconductor substrate 10. The transistor gate structure 14 is formed while the first polysilicon (poly) layer 22 of the lower electrode of the capacitor is formed. A dielectric layer 24 is formed on the surface of the semiconductor substrate 10. The second poly layer 26 is deposited on the surface of the dielectric layer 24 of the upper first layer 22 used as an upper electrode of the capacitor. The dielectric layer between the first poly layer 22 and the second poly layer 26 is used as the dielectric layer of the capacitor, and also used as the isolation between the first poly layer 22 and the second poly layer 26.

However, this capacitor structure can only be applied in the aforementioned process, but can not be applied in the self-aligned salicide process. Any step of the self-aligned salicide process can not be omitted. Otherwise, capacitors are unable to be formed. Accordingly, a method of forming PIP capacitors by using the self-aligned salicide process is provided.

SUMMARY OF THE INVENTION

The present invention provides a method of forming poly insulator poly PIP capacitors by using the self-aligned salicide process, wherein the oxide layer of the self-aligned salicide block is directly formed and used as the dielectric layer of the PIP capacitors.

The process omits some steps due to the formation of the PIP capacitors.

The present invention first provides a semiconductor substrate having an isolation structure and a transistor structure formed thereon. The PIP gate of the transistor structure is formed while the first poly layer is formed on the isolation structure and used as the lower electrode of the capacitor. Next, the oxide layer and a second patterned poly layer are formed on the surface of the semiconductor and used as a self-aligned salicide block. The second patterned poly layer on the first poly layer is used as the upper electrode of the capacitor. A portion of the oxide layer of the transistor structure is removed, leaving the oxide layer 50 on the isolation structure and the first poly layer and the second poly layer and used as a dielectric layer of the capacitor. Finally, the self-aligned salicide process is performed to form a self-aligned salicide on the surface of the transistor structure and the second poly layer.

These and other objectives of the present invention will become obvious to those of ordinary skill in the art after reading the following detailed description of the preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

The present invention discloses a method of fabricating capacitors for mixed mode analog devices. These capacitors are formed in the self-aligned salicide process by as stacked PIP capacitors, wherein the oxide layer of the self-aligned salicide block is directly formed and used as the dielectric layer of the stacked PIP capacitors.

Referring to FIGS. 2a to 2e, the preferred embodiment of the present invention is shown illustrating the sectional structure of each step of manufacturing the PIP transistor by using the self-aligned salicide process. Referring to all of these Figs, the manufacturing method of the present invention includes the following procedures.

Figure 1:
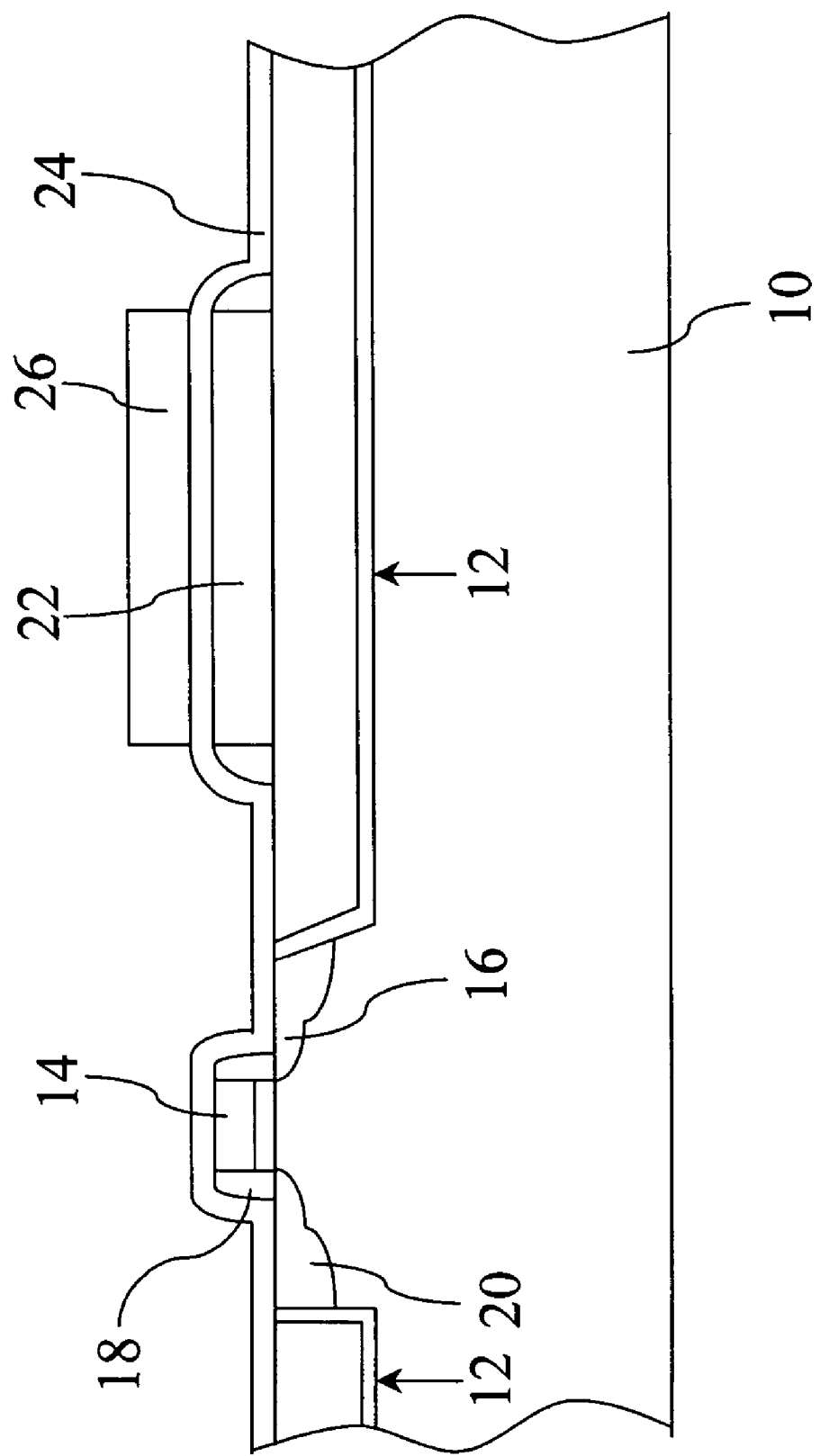
FIG. 1 is a schematic diagram illustrating a conventional capacitor.
Figure 2A:
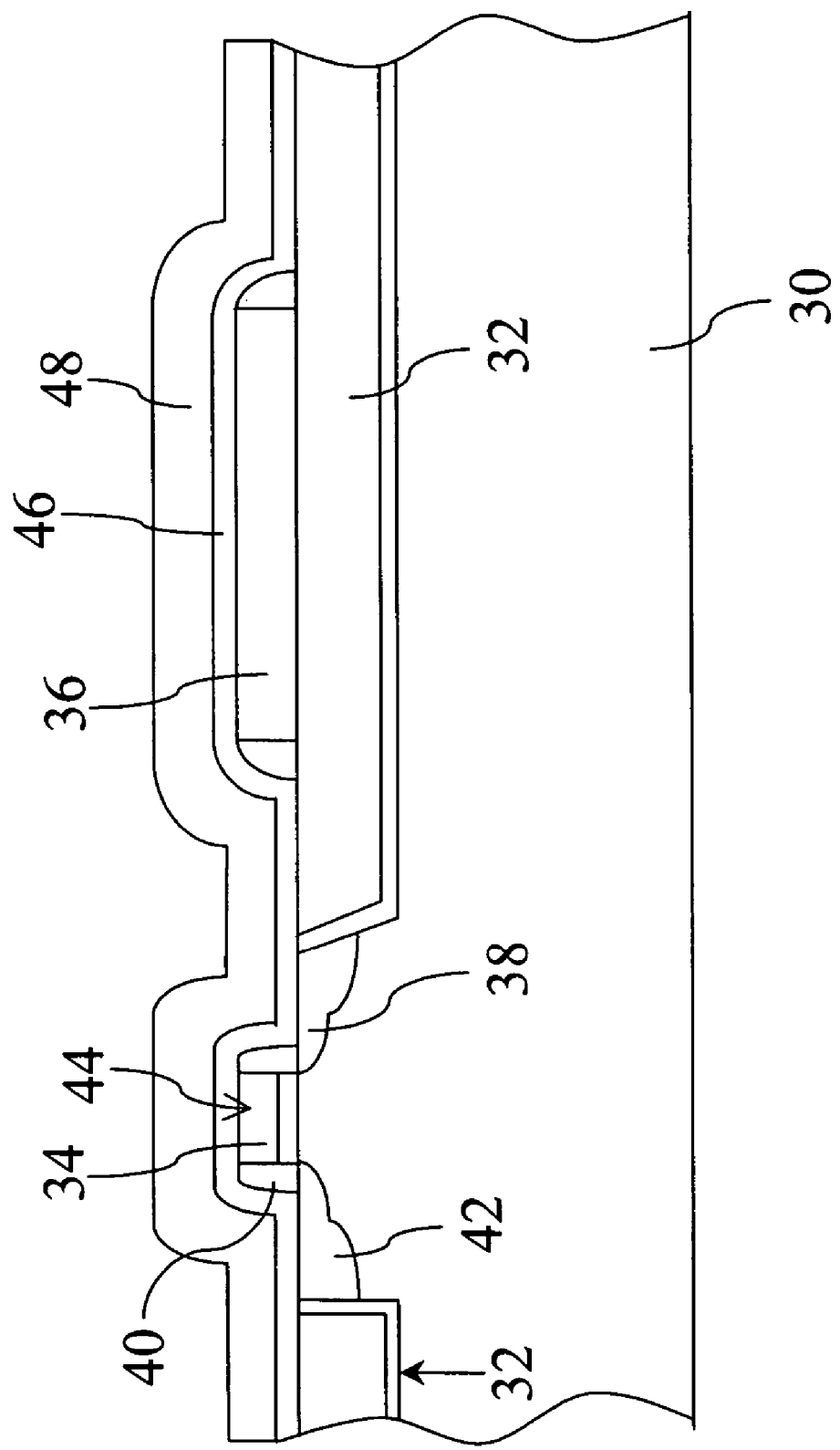
FIGS. 2a to 2e are sectional diagrams illustrating the structure of each step of manufacturing PIP capacitors according to an embodiment of the present invention.

First, referring to FIG. 2a which illustrates standard deep sub-micron processing, several shallow trench isolation (STI) structures 32 are formed in a semiconductor substrate 30. A poly gate structure 34 is formed on the semiconductor substrate 30 while a first poly layer 36 is formed on the STI structures 32 and used as a lower electrode of the capacitor. The poly gate structure 34 is used as a mask for performing an ion implantation with low concentration on the semiconductor substrate 30 to form the lightly doped area 38. Next, the gate spacers 40 are formed on two sidewalls of the poly gate structure 34. The poly gate structure 34 and the gate spacers 40 are used as a mask for performing an ion implantation with high concentration on the semiconductor substrate 30 to form the heavily source/drain doped area 42, completing the manufacture of a transistor structure 44. A rapid thermal anneal (RTA) is performed. Thus, the basic elements on semiconductor substrate 30 are completed.

Next, referring to FIG. 2a again, an oxide layer 46 of the self-aligned salicide block is formed on the surface of the semiconductor substrate 30 by using chemical vapor deposition (CVD). The thickness of the oxide layer 46 is between 200 Å and 2000 Å. The oxide layer 46 is used as the self-aligned salicide block, and also as the dielectric layer of the capacitor. Next, a second poly layer 48 is deposited on the surface of the oxide layer 46.

Figure 2B:
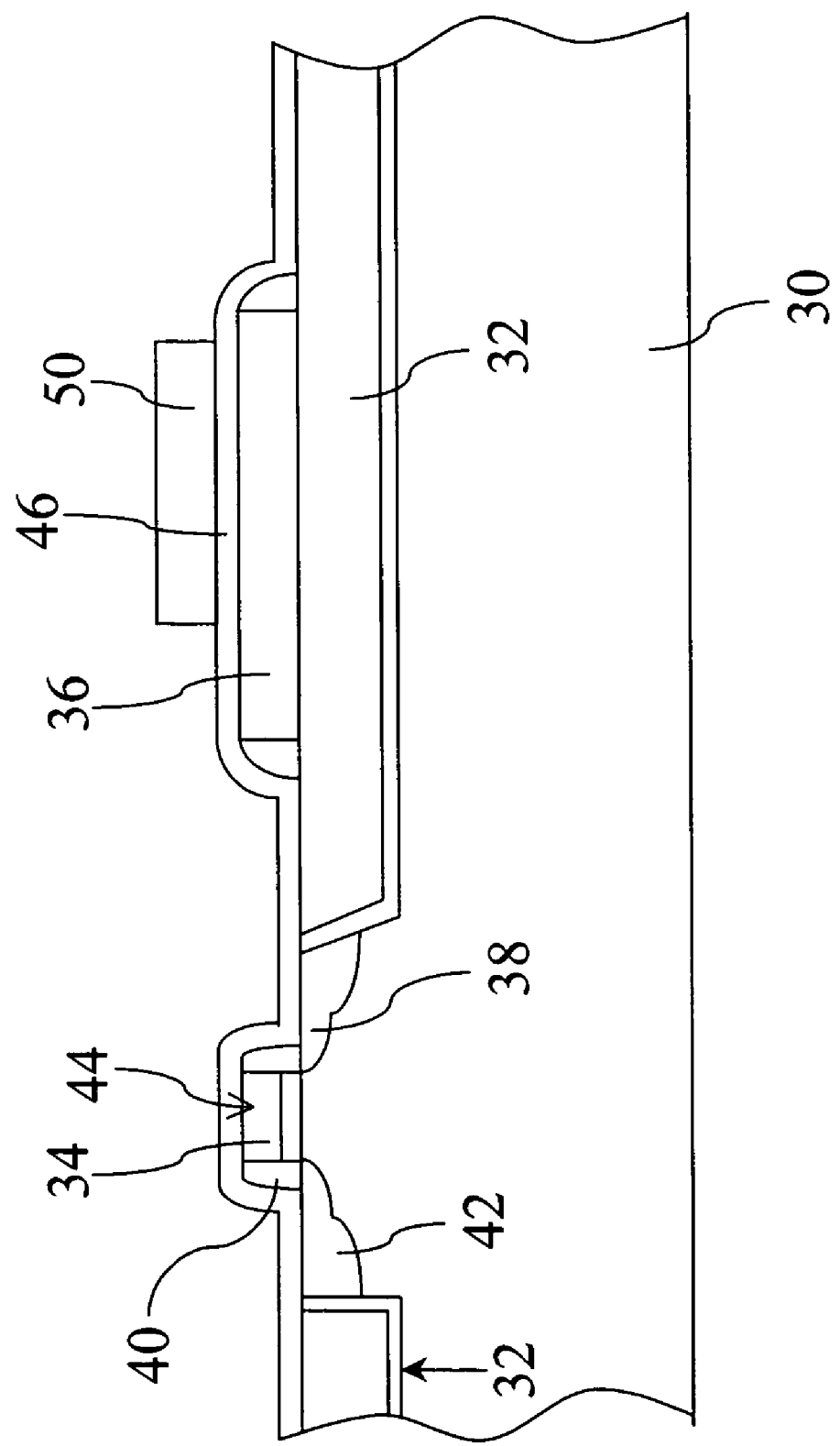

Next, one portion of the second poly layer 48 is removed by using a lithography and etching process, leaving the patterned second poly layer 50 on the first poly layer 36 on surface of the semiconductor substrate 30 shown in FIG. 2b, to be used as an upper electrode of the capacitor.

Figure 2C:
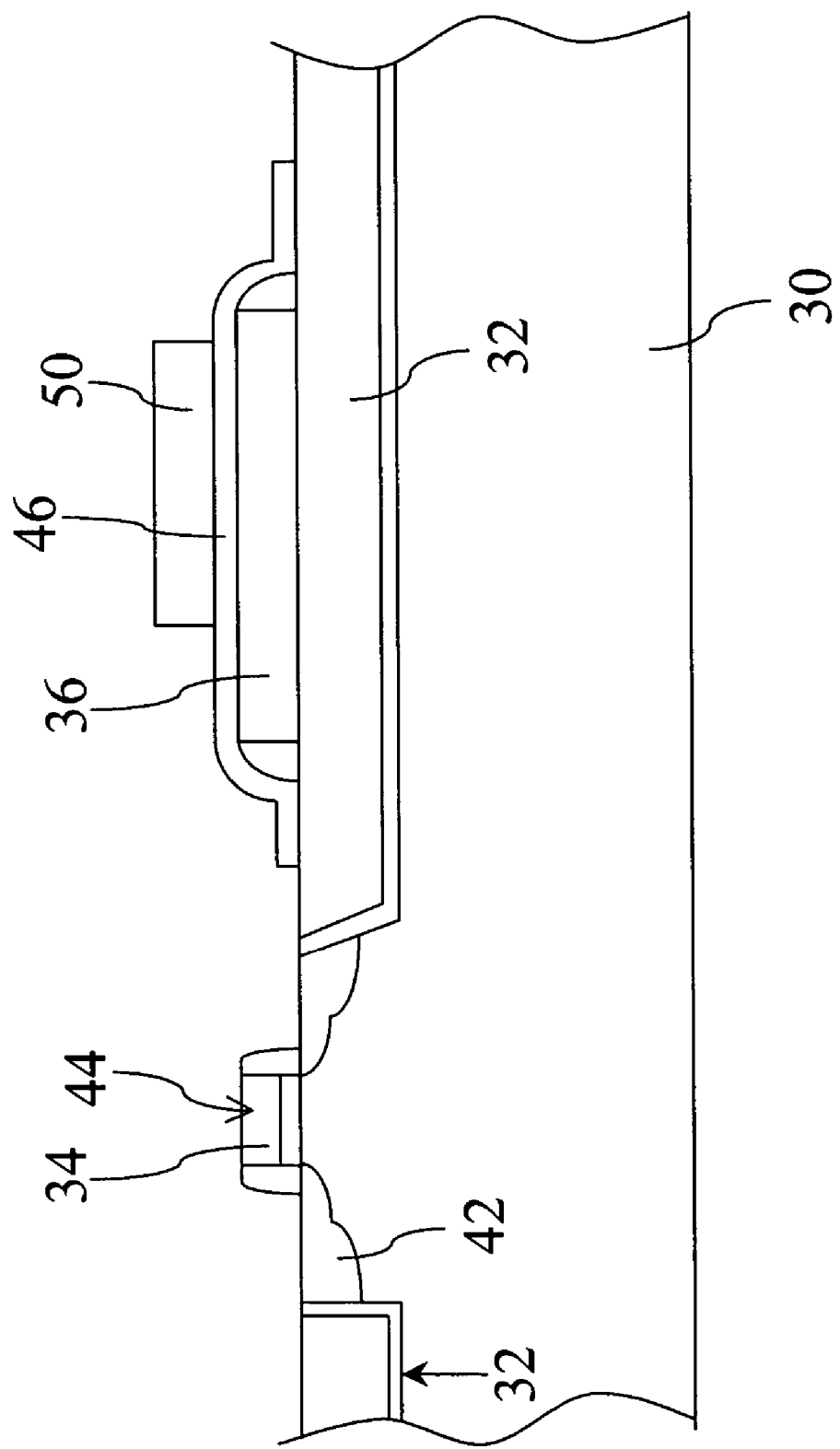

As shown in FIG. 2c, one portion of the oxide layer 46 on the transistor structure 44 is removed by using a lithography and etching process, resulting in a residual oxide layer 46 remaining on the STI structures 32, the first poly layer 36, and the second patterned poly layer 50. Further, the residual oxide layer is used as the dielectric layer of the capacitor. The oxide layer 46 needs to cover the first PIP layer 36, in order to prevent salicide formation during the subsequent self-aligned salicide process.

Figure 2D:
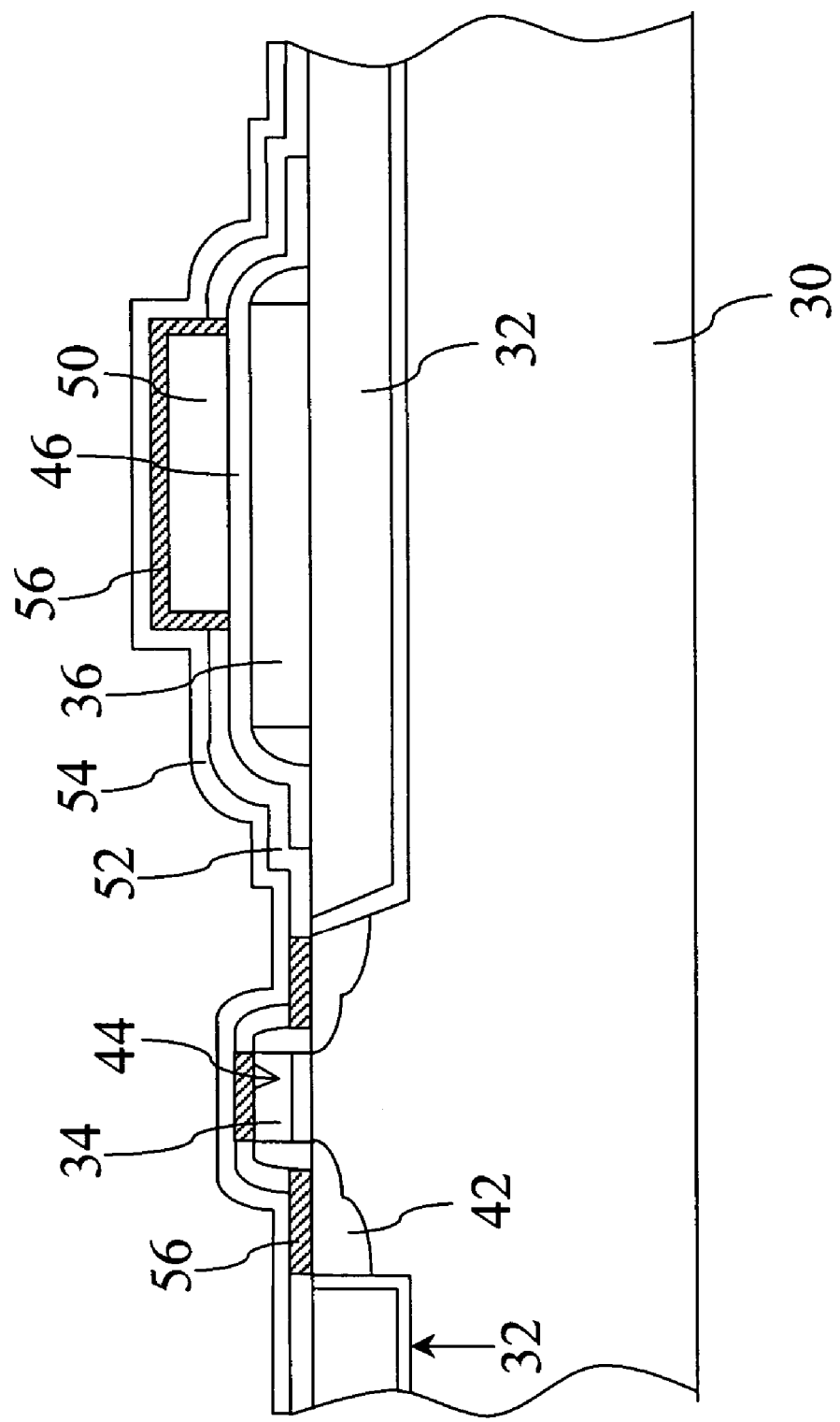
Figure 2E:
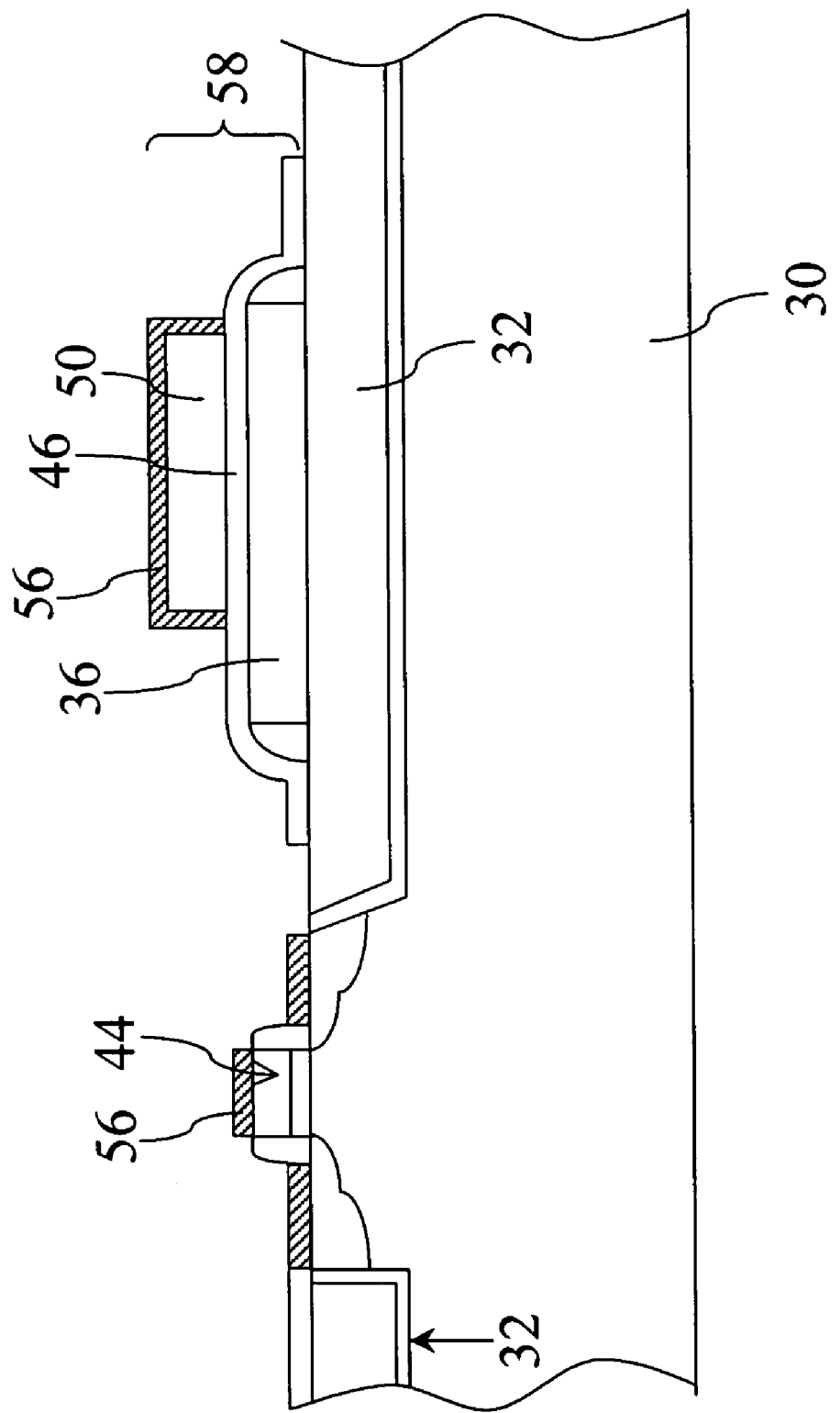

Next, the self-aligned salicide process is performed, as shown in FIG. 2d. The surface of the semiconductor substrate 30 is sputtered to form a cobalt metal layer 52 and a TiN layer 54. The first RTA process is performed again, resulting in the silicidation reaction on the junction between the cobalt metal layer 52 and the poly gate 34 of the transistor structure 44 and the junction between the heavily doped source/drain area 42 and the patterned poly layer 50, forming the self-aligned cobalt metal silicide 56. The unreacted remaining cobalt metal layer 52 and TiN layer 54 are selectively removed by a wet etching process. A second RTA process is performed to form the stable self-aligned cobalt metal silicide structure 56 on the semiconductor substrate 30 as shown in FIG. 2e. The material of cobalt metal layer 52 is cobalt metal. Alternatively, the material of the cobalt metal layer 52 can comprise titanium, nickel, palladium, platinum, or similar metal.

In the structure formation with the self-aligned salicide in the semiconductor process, the stacked PIP capacitor structure 58, which is composed of the lower electrode of the first poly layer 56, the dielectric layer of the oxide layer 46, and the lower electrode of the patterned poly layer 50, is provided.

The oxide layer of the self-aligned salicide block of the present invention is directly used as the dielectric layer of the capacitor, so as to omit some of the processing steps when forming the PIP capacitors.

The above embodiment is only intended as one illustration the present invention; it does not, however, limit the present invention to the above embodiment. Accordingly, various modifications and changes may be made without departing from the spirit and scope of the present invention as described in the following claims.

What is claimed is:

1. A method of forming poly insulator poly capacitors by using a self-aligned salicide process, comprising:

providing a semiconductor substrate having a shallow trench isolation structure and a transistor structure thereon, wherein a polysilicon gate of the transistor structure being formed while forming a first polysilicon layer on the shallow trench isolation structure, the first polysilicon layer is used as a lower electrode of a capacitor;

forming an oxide layer on a surface of the semiconductor substrate, the first polysilicon layer, the shallow trench isolation structure and the transistor structure, the oxide layer is used as a self-aligned salicide block and;

forming a second patterned polysilicon layer on a surface of the oxide layer, the second patterned polysilicon layer being on the first polysilicon layer and the surface of the oxide layer is used as an upper electrode of the capacitor;

removing a portion of the oxide layer on the transistor structure, leaving a residual oxide layer on and directly contacting the shallow trench isolation structure and a top surface of, the first polysilicon layer, the residual oxide layer, being used as a dielectric layer; and performing a self-aligned salicide process to form a self-aligned salicide on a surface of the transistor structure on the semiconductor substrate and top surface and sidewall surfaces of the second patterned polysilicon layer, performing the self-aligned salicide process including the steps of;

forming a metal layer on the semiconductor substrate, the transistor structure and the second patterned polysilicon layer;

performing a rapid thermal anneal heating process, resulting in a silicidation reaction on a junction between the metal layer and the transistor structure and the second patterned polysilicon layer, forming a self-aligned salicide; and removing unreacted portions of the metal layer.

2. The method of forming poly insulator poly capacitors using the self-aligned salicide process of claim 1, wherein the transistor structure comprises the polysilicon gate, a lightly doped area, a gate spacer, and a heavily doped source/drain area.

3. The method of forming poly insulator poly capacitors by using a self-aligned salicide process of claim 1, wherein the oxide layer is formed by chemical vapor deposition.

4. The method of forming poly insulator poly capacitors using the self-aligned salicide process of claim 1, wherein the thickness of the oxide layer is between 200 and 2000 Å.

5. The method of forming poly insulator poly capacitors using the self-aligned salicide process of claim 1, wherein forming the second patterned polysilicon layer further comprises:

forming a second polysilicon layer on the semiconductor substrate and on the surface of the oxide layer;

forming a patterned photoresist on the top surface of the second polysilicon layer; and etching the second polysilicon layer by patterned photoresist used as a mask to form the second patterned polysilicon layer on the surface of the oxide layer and on the first polysilicon layer.

6. The method of forming poly insulator poly capacitors using the self-aligned salicide process of claim 1, wherein the metal layer comprises cobalt, titanium, nickel, palladium, platinum, or a combination of these.

7. The method of forming poly insulator poly capacitors using the self-aligned salicide process of claim 1, wherein removing the unreacted portions of the metal layer is achieved by wet etching.

8. The method of forming poly insulator poly capacitors using the self-aligned salicide process of claim 1, wherein after forming the self-aligned salicide, another rapid thermal anneal heating process is performed to stabilize the self-aligned salicide.

* * * * *